US011715616B2

(12) United States Patent
Frisch et al.

(10) Patent No.: US 11,715,616 B2
(45) Date of Patent: Aug. 1, 2023

(54) DUAL LOW VACUUM-ULTRAHIGH VACUUM SYSTEM FOR LARGE-SCALE PRODUCTION OF MICRO-CHANNEL PLATE PHOTOMULTIPLIERS

(71) Applicant: The University of Chicago, Chicago, IL (US)

(72) Inventors: Henry J. Frisch, Chicago, IL (US); Evan Angelico, San Marcos, CA (US); Andrey Elagin, Bolingbrook, IL (US); Eric Spieglan, Lisle, IL (US); Bernhard W. Adams, Naperville, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 385 days.

(21) Appl. No.: 17/082,292

(22) Filed: Oct. 28, 2020

(65) Prior Publication Data

US 2021/0134552 A1    May 6, 2021

Related U.S. Application Data

(60) Provisional application No. 62/928,598, filed on Oct. 31, 2019.

(51) Int. Cl.
*B23K 1/00* (2006.01)
*B23K 3/00* (2006.01)
*H01J 9/12* (2006.01)
*H01J 37/244* (2006.01)
*G01T 1/202* (2006.01)

(52) U.S. Cl.
CPC .............. *H01J 9/12* (2013.01); *B23K 1/0008* (2013.01); *G01T 1/202* (2013.01); *H01J 37/244* (2013.01)

(58) Field of Classification Search
CPC .... B23K 1/0008; B23K 20/023; B23K 31/02; F28D 1/05375; F28D 9/0062; H01L 31/0203; H01J 43/246
See application file for complete search history.

(56) References Cited

U.S. PATENT DOCUMENTS

| | | | |
|---|---|---|---|
| 8,604,440 B2 * | 12/2013 | Frisch | G01T 1/363 250/367 |
| 9,244,180 B2 | 1/2016 | Frisch et al. | |
| 9,625,588 B2 | 4/2017 | Frisch et al. | |
| 9,911,584 B2 | 3/2018 | Frisch et al. | |
| 11,194,059 B2 * | 12/2021 | Frisch | H01L 31/0203 |

(Continued)

OTHER PUBLICATIONS

Assembly of Large-Area Planar MCP-based Photo-Detectors Without Vacuum Transfer of the Window; Invited talk at LIGHT17, Ringberg Castle, Bavaria; Oct. 17, 2017; pp. 1-45.

(Continued)

*Primary Examiner* — Erin B Saad
(74) *Attorney, Agent, or Firm* — Bell & Manning, LLC

(57) ABSTRACT

Systems and methods for the batch production of large numbers of highly uniform multichannel-plate photomultiplier tubes (MCP-PMTs) for large-scale applications are provided. The systems and methods employ dual, nested low-vacuum (LV) and UHV processing in a rapid-cycling, small-footprint, scalable, batch-production facility that is capable of fabricating many MCP-PMTs simultaneously.

12 Claims, 7 Drawing Sheets

(56) References Cited

U.S. PATENT DOCUMENTS

| | | | | |
|---|---|---|---|---|
| 2004/0099712 | A1* | 5/2004 | Tonkovich | B01J 19/0093 |
| | | | | 228/183 |
| 2007/0187596 | A1* | 8/2007 | Frisch | G01T 1/22 |
| | | | | 250/309 |
| 2010/0027740 | A1* | 2/2010 | Adams | G21K 1/06 |
| | | | | 378/45 |
| 2011/0210259 | A1* | 9/2011 | Elam | C23C 16/407 |
| | | | | 427/595 |
| 2013/0283585 | A1* | 10/2013 | Desireddy | F28F 1/022 |
| | | | | 29/402.18 |
| 2017/0278687 | A1* | 9/2017 | Frisch | H01J 40/16 |
| 2020/0326433 | A1* | 10/2020 | Frisch | H01L 31/0203 |
| 2021/0134552 | A1* | 5/2021 | Frisch | H01J 9/12 |

OTHER PUBLICATIONS

The Psec-LAPPD program at Chicago; CPAD, Albuquerque NM—Oct. 13, 2017; pp. 1-37.

Adams et al., "A Brief Technical History of the Large-Area Picosecond Photodetector (LAPPD) Collaboration," arXiv:1603.01843v1 [physics.ins-det], Mar. 6, 2016; pp. 1-46.

Andrey Elagin, LAPPD™ Large-Area Picosecond Photo-Detectors, Research Techniques Seminar, Fermilab, Nov. 28, 2017; pp. 1-73.

The Development of Non-Vacuum Transfer Process for Large-volume Commercial Title Production, Document available on the web, Oct. 14, 2012.

* cited by examiner

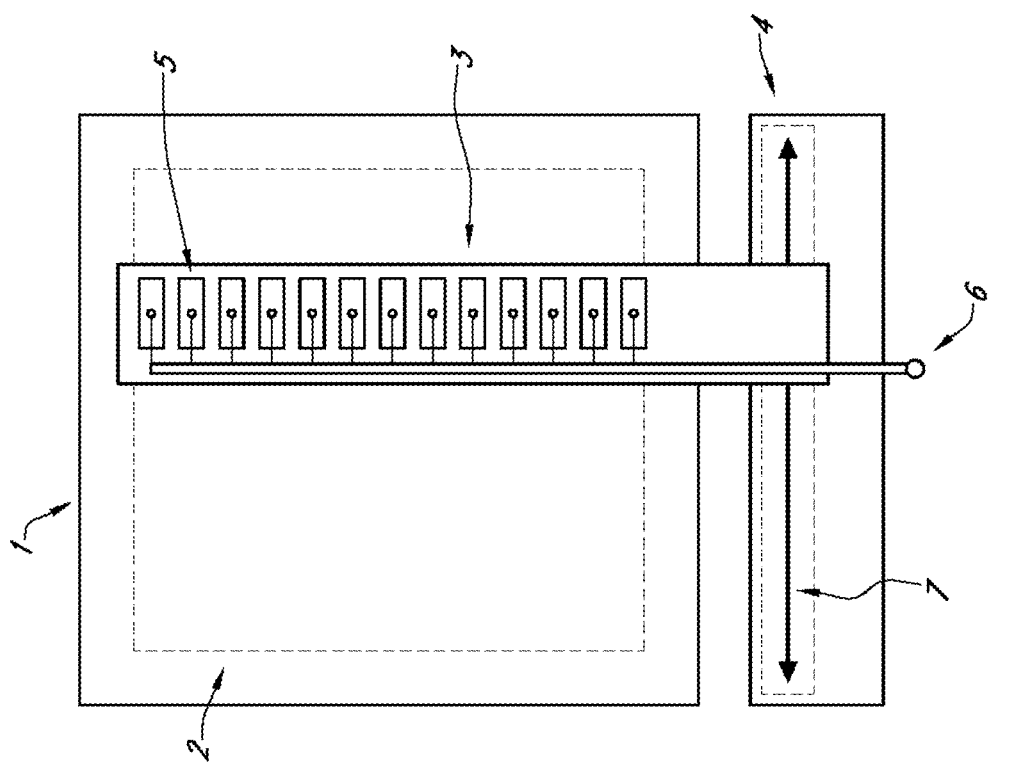

DUAL LOW VACUUM-ULTRAHIGH VACUUM SYSTEM FOR LARGE-SCALE PRODUCTION OF MICRO-CHANNEL PLATE PHOTOMULTIPLIERS

CROSS-REFERENCE TO RELATED APPLICATIONS

The present application claims priority to U.S. provisional patent application No. 62/928,598 that was filed Oct. 31, 2019, the entire contents of which are incorporated herein by reference.

REFERENCE TO GOVERNMENT RIGHTS

This invention was made with government support under grant numbers DE-SC0015267 and DE-SC0008172 awarded by The Department of Energy and grant number 1707981 awarded by The National Science Foundation. The government has certain rights in the invention.

BACKGROUND

Multichannel Plate-Photomultiplier Tube-based photodetectors (MCP-PMTs) are unique among current photodetectors in having the capability of 10-micron pixel size in systems with many meter-squared coverage, psec-level time resolution, sub-mm space resolution, gains greater than $10^7$, and low noise. Recent developments have made possible the coverage of large areas by advances in capillary substrate manufacture, resistive and emissive coatings, and fast economical electronics systems. The fast rise-times and large signal-to-noise ratios allow a low electronics channel-count 'tiling' of areas of many square meters, maintaining micron pixel size and sub-mm space resolution. These developments have removed previous technical barriers in MCP plate manufacture, MCP-PMT lifetime, and electronics channel-count that have limited wide-spread exploiting of the unique capabilities for implementing psec-timing over areas of tens to hundreds of square meters. However, cost of manufacture remains a dominant barrier to the adoption of MCP-PMT technology. The cost is dominated by the complex one-at-a-time production and assembly process, and by process yield. A high-throughput high-yield batch process for production is necessary to lower the cost and enable adoption for large-volume applications such as whole-body scanners for medical imaging, non-proliferation monitoring, optical time projection cameras, and large detectors in scientific exploration.

Two manufacturing processes are typically employed in the production of MCP-PMTs. In the first process, single MCP-PMT or small quantities of MCP-PMTs are fabricated for scientific applications using an ultrahigh vacuum (UHV) transfer method, in which the detectors or components thereof (e.g., the windows) are transferred from one ultrahigh vacuum chamber to another using complex and expensive ultrahigh vacuum transfer mechanisms. The second process includes a dual UHV vacuum system with inner and outer UHV vacuum spaces. This dual UHV design limits the throughput by requiring a UHV flange and metal gasket seal at the joint between an upper UHV vessel and a lower UHV vessel. Since commercially available UHV flanges are limited in size, only a single detector could be produced at a time in such a dual UHV vacuum system. Therefore, the fabrication of many MCP-PMTs would require operating many small dual UHV vacuum systems at the same time.

SUMMARY

Systems for fabricating a plurality of MCP-PMT detectors and methods for using the systems are provided.

One embodiment of a system for fabricating a plurality of microchannel plate photomultiplier tube (MCP-PMT) detectors includes: a low-vacuum vessel comprising a housing and a seal, wherein the housing and the seal define an interior volume; a low-vacuum pumping system comprising at least one pump connected to the low-vacuum vessel, the low-vacuum pumping system configured to evacuate the interior volume of the low-vacuum vessel to a pressure in the range from $10^{-5}$ to $10^{-8}$; a plurality of detector modules contained within the low-vacuum vessel; one or more heaters in thermal communication with the detector modules; an ultrahigh-vacuum manifold connected to the internal volumes of the detector modules; and an ultrahigh-vacuum system comprising at least one pump connected to the ultrahigh-vacuum manifold, the ultrahigh-vacuum system configured to evacuate the ultrahigh-vacuum manifold to a pressure of $10^{-9}$ or lower. The detector modules include: a window; a base, wherein the window and the base define an internal volume of the detector module; and a microchannel-plate photomultiplier tube detector disposed within the internal volume of the detector module.

One embodiment of a method of fabricating a plurality of microchannel plate photomultiplier tube (MCP-PMT) detectors using a system of a type described herein includes the steps of: placing solder into a gap between the window and the base of the detector modules or adjacent to a gap between the window and the base of the detector modules; evacuating the internal volume of the low-vacuum vessel to a low vacuum pressure in the range from $10^{-5}$ to $10^{-8}$; evacuating the ultrahigh-vacuum manifold and the internal volumes of the detector modules to an ultrahigh vacuum pressure of $10^{-9}$ or lower; heating the detector modules to a temperature at which the solder melts to fill the gaps between the windows and the bases, while the low vacuum pressure is maintained in the internal volume of the low-vacuum vessel and the ultrahigh vacuum pressure is maintained in the internal volumes of the detector modules; cooling the detector modules to a temperature at which the solder solidifies to form a solder seal between the windows and the bases, while the low vacuum pressure is maintained in the internal volume of the low-vacuum vessel and the ultrahigh vacuum pressure is maintained in the internal volumes of the detector modules; and releasing the vacuum in the internal volume of the low-vacuum vessel.

BRIEF DESCRIPTION OF THE DRAWINGS

Illustrative embodiments of the invention will hereafter be described with reference to the accompanying drawings, wherein like numerals denote like elements.

FIG. 7 shows one embodiment of a light-source scanning system for testing MCP-PMTs contained within the support manifold.

DETAILED DESCRIPTION

Systems and methods for the batch production of large numbers of highly uniform MCP-PMTs for large-scale applications are provided. Examples of applications requiring large numbers of identical MCP-PMTs include: 1) research in elementary particle physics and nuclear physics; 2) low light-level imaging applications, such as microscopy, spectroscopy, and material characterization; 3) medical imaging; 4) radiation detection, reactor monitoring, and nuclear non-proliferation; and 5) night vision applications.

The systems and methods employ dual, nested low-vacuum (LV) and UHV processing in a rapid-cycling, small-footprint, scalable, batch-production facility that is capable of fabricating many MCP-PMTs simultaneously. Using the systems described herein, thousands of MCP-PMTs can be produced per year. For example, a single system could produce at least 2,000, at least 5,000, or at least 10,000 MCP-PMTs in the span of one year.

In this method, multiple unsealed MCP-PMT detector modules are pre-assembled inside an outer LV vessel. The MCP-PMT detector modules can be supported by a support manifold with a vertical and/or horizontal spacing. Within the LV vessel, the detector modules are connected to a separate UHV manifold that maintains the internal volumes of the detector modules at UHV pressures. While under LV pressures in the LV vessel, each of the MCP-PMT detector modules undergoes a high-temperature bake-out that activates an internal getter and forms a hermetic solder seal that seals the detector modules. The vacuum in the LV vessel is then released, while the detector modules remain connected to the UHV manifold. This enables full access to the modules for leak-checking, photocathode synthesis, characterization, and testing, and/or MCP-PMT performance characterization and testing under UHV conditions prior to the final hermetic sealing of the detector modules.

The LV vessel can remain at or near room temperature (e.g., ~20 to 25° C.) and allow for the uniform heating of detector modules under vacuum. The absence of the need for a high-temperature bake-out of the outer LV vessel is significant in lowering the time needed for a production cycle, due to the much smaller thermal mass that needs to be thermally cycled; during the bake-out of the detector modules, only the modules and their support manifold need to be heated. In addition, an external large oven or other heating apparatus around the LV vessel is not necessary, allowing efficient use of floor space for an industrial plant containing multiple copies of the MCP-PMT fabrication systems. The absence of the need for a UHV outer vacuum vessel also lowers the time needed for a production cycle, due to a simple O-ring or gasket seal rather than a metal seal with a bolted flange, with a faster pump-down time and a less demanding target base pressure. However, the most significant effect on throughput is the ability to fabricate many modules in a single thermal cycle.

Figure 1:
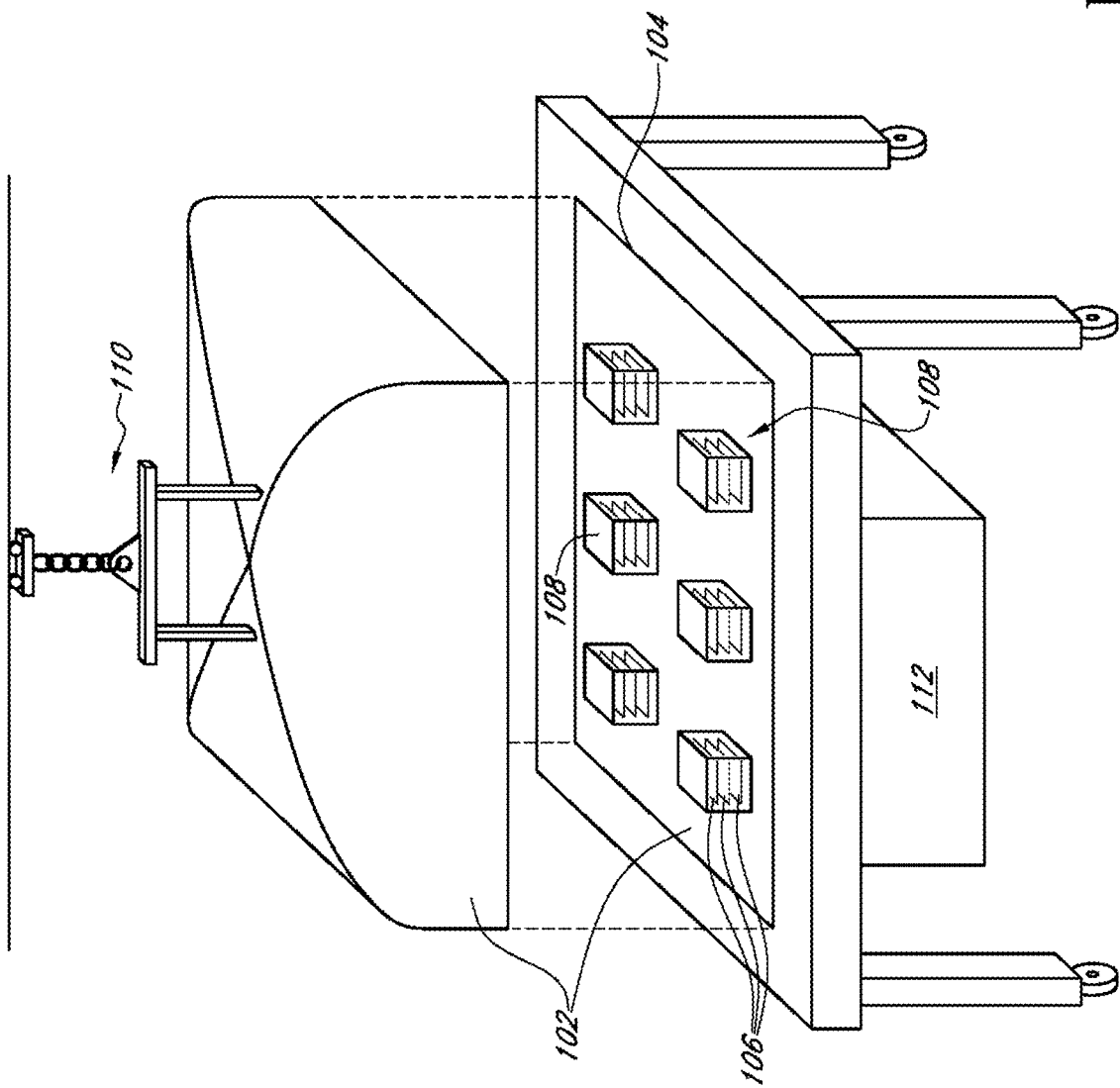
FIG. 1 shows one embodiment of a system for the high-throughput fabrication of multiple MCP-PMTs.

One embodiment of a dual LV-UHV system for the large-scale production of MCP-PMTs is shown schematically in FIG. 1. The system includes an LV vessel comprising a two-part housing 102 with a seal 104 between the first and second parts of the housing. The internal volume of the LV vessel provides thermal insulation for a high-temperature bake-out of the detector modules 106 contained within the internal volume. The LV vessel can be made of any material that is compatible with LV conditions; however, stainless steel is a good choice in terms of retaining heat and durability. The seal can be an inexpensive polymer O-ring or gasket because it needs only to maintain a vacuum pressure in the range from $1\times10^{-5}$ to $1\times10^{-8}$ Torr in the internal volume of the LV vessel. In fact, pressures in the range from $1\times10^{-5}$ to $1\times10^{-7}$ Torr, or even from $1\times10^{-5}$ to $1\times10^{-6}$ Torr, will generally suffice for the LV vessel. Because this level of vacuum is substantially less stringent than that required for a conventional UHV vacuum-transfer system, a high-temperature bake-out of the LV vessel is not necessary. Consequently, the LV vessel can be sealed using an inexpensive, reusable vacuum seal, such as an O-ring or gasket, which may be seated within a groove defined in a surface of the housing. The size and shape of such seals can be easily customizable, thereby avoiding the restrictions on the size and shape of the LV vessel. Thus, LV vessels having large footprints with circular or non-circular shapes can be used. In addition, a large O-ring or gasket seal is faster and less labor-intensive to implement than the metal seals and bolted flange that are required in conventional UHV transfer systems, allowing a simple vertical lift-off mechanism 110. Suitable O-ring and gasket materials include organic or inorganic elastomeric rubbers, such as fluoropolymer elastomers (e.g., Viton®, Kalrez®, FFKM) and silicone rubbers.

Detector modules 106 can be supported in one or more support manifolds 108, to allow for the stacking and spacing of a plurality of detector modules within the internal volume of the LV vessel. In the illustrative embodiment of FIG. 1, the system includes a single O-ring-sealed LV vessel that houses 18 MCP-PMT detector modules 106, which are arranged in stacks of three within six support manifolds 108. However, the support manifolds can include more or fewer detector modules, and the support manifolds need not be arranged as shown in FIG. 1. Various support systems 112, including pumping systems, electronic systems, and control and data systems can be housed below the lower part of two-part housing 102; however, these systems can be located at different locations.

Figure 2:
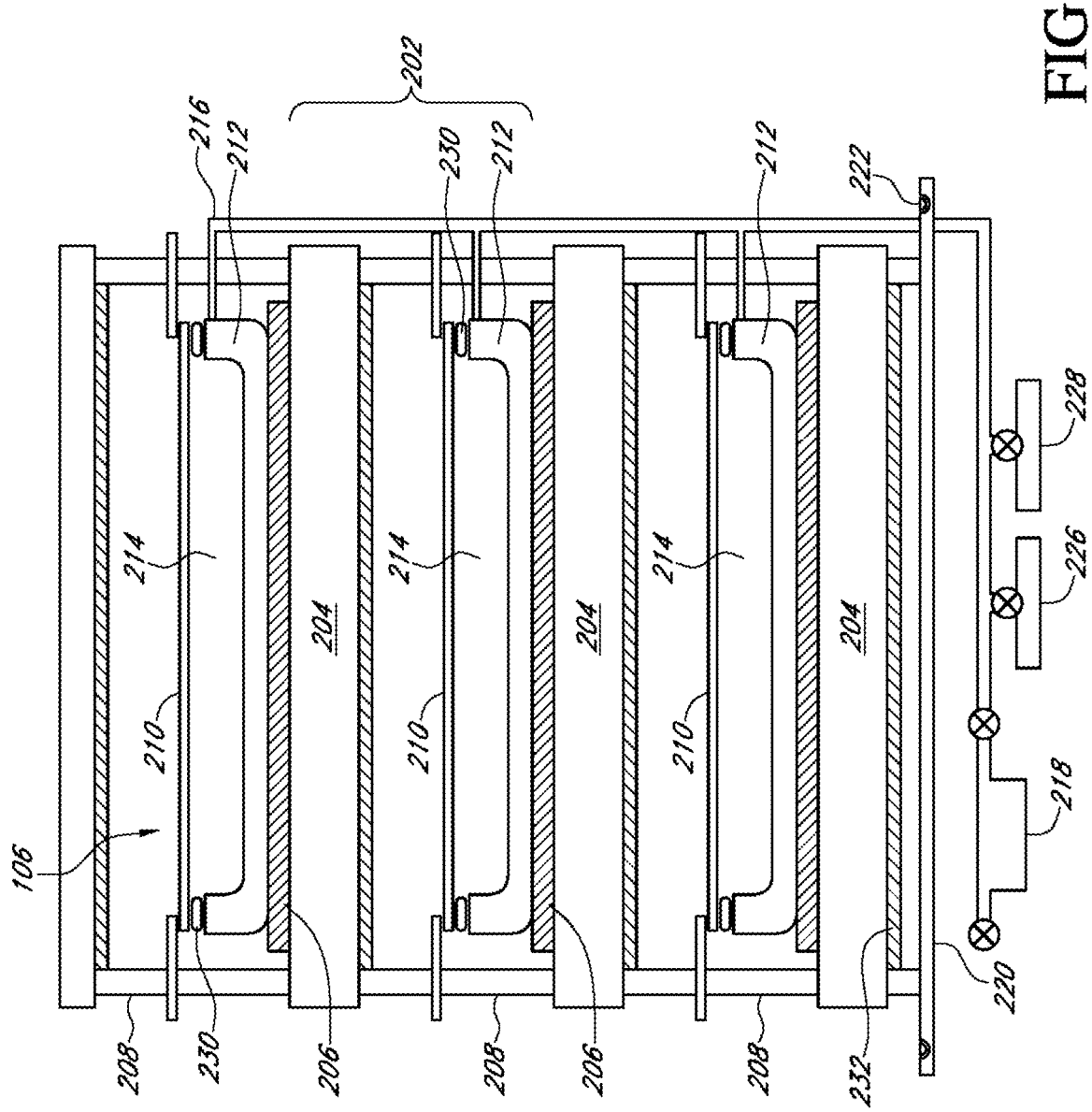
FIG. 2 shows one embodiment of a support manifold containing three MCP-PMTs in a vertical arrangement connected to a UHV manifold.

An illustrative embodiment of a support manifold designed to hold three detector modules in a vertical arrangement (a stack) is shown in FIG. 2. The support manifold includes an MCP-PMT detector chamber 202 for each MCP-PMT detector module. Within each chamber 202, a detector module 106 is supported on a support 204 that is in direct or indirect thermal contact with a heater 206. Supports 204 are spaced apart by spacers 208. Each detector module includes an entrance window 210 and a base 212 that come together to form an internal vacuum volume 214 within each module. A UHV manifold 216 is connected to internal volumes 214 of the detector modules. UHV manifold 216 includes conduits (e.g., pipes or tubes) in fluid communication with internal volumes 214 and with one or more UHV pumps 218, such that the internal volumes 214 of the detector modules and the UHV manifold 216 can be evacuated to a pressure of $10^{-9}$ Torr or lower. The support manifold is supported on a surface of one part of LV vessel 220 and can be sealed within the internal volume of LV vessel 220 via a simple O-ring (or gasket) seal 222. UHV manifold 216 can include one or more valves (not shown) positioned to reversibly isolate individual detector modules from the rest of the UHV manifold for cathode synthesis, leak checking, and characterization. Optionally, each chamber may also include an external capacitatively-coupled anode signal-pickup board 232 associated with fast electronics for measuring performance parameters (e.g., for taking pulse measurements) of the MCP-PMTs, including gain, dark current, efficiency, and response uniformity.

In situ methods of fabricating a reflection-mode photocathode in a microchannel plate photomultiplier tube detector are described in U.S. Pat. No. 9,911,584, the entire contents of which are incorporated herein by reference for the purpose of providing a detailed description of the photocathode synthesis process. Briefly, the process includes forming an unsealed detector module, wherein the module includes: a window having an outer surface and an inner surface, wherein the inner surface faces opposite the outer surface; and a detector base (or "body") having an outer surface and an inner surface, the inner surface facing opposite the outer surface, wherein the inner surface of the window faces an inner surface of the base. A microchannel plate detector is then provided in the unsealed detector package. The microchannel plate detector comprises: at least one microchannel plate having a cathode surface that is coated with a photocathode precursor material and that faces the inner surface of the window and a second surface that faces opposite the cathode surface; at least one spacer that separates the at least one microchannel plate from the window; and at least one spacer that separates the at least one microchannel plate from the base. After the solder seal is formed to seal the detector module, the detector module is evacuated through the one or more conduits leading to the UHV manifold. An alkali metal-containing vapor is then introduced into the evacuated sealed detector module through the UHV manifold, wherein the alkali metal-containing vapor reacts with the photocathode precursor material to form a photocathode material on the cathode surface of the at least one microchannel plate. If excess alkali metal-containing vapor is present, it may be evacuated from the sealed detector enclosure through the UHV manifold.

In the embodiment of the system shown in FIG. 2, a gas-analyzer (e.g., a residual gas analyzer (RGA)) 226 and an alkali metal (e.g., sodium, potassium, cesium, or rubidium) vapor source 228 (to form photocathode materials on a cathode surface of the microchannel plate detectors prior to forming the final seal on the modules, as discussed in more detail below) are connected to UHV manifold 216. Alkali vapor metal sources are commercially available and include metal evaporation sources and getter sources. An inert gas source (e.g., a lecture bottle, pressurized cylinder, or other pressurized container filled with a non-reactive gas, such as a rare gas, like helium or argon) can also be connected to the LV vessel in order to perform leak-checking on all or selected detector modules using the gas analyzer.

The systems described here can be used to fabricate a plurality of MCP-PMTs by placing a solid solder material 230 into, or adjacent to, a gap between the window 210 and the base 212 of each detector module, followed by evacuating the internal volume of the LV vessel to a low pressure. Then, while the internal volume of the LV vessel is being maintained at an LV pressure and the internal volumes 214 of detector modules 106 are being maintained at a UHV pressure, detector modules 106 are heated by heaters 206 to carry out a high-temperature bake-out of the detector modules during which the solder material 230 melts to form a solder seal between the windows and bases of the detector modules. The temperature of the high-temperature bake-out should be high enough to melt the solder and to effectively remove water from the detector modules. Typically, the high-temperature bake-out will be carried out at a temperature greater than 140° C. and, more typically, of at least 250° C. For example, temperatures in the range from about 150° C. to about 400° C. can be used. Optionally, one or more internal surfaces of the detector module, such as, but not limited to, the detector base, may be coated with a reactive getter that is activated at the temperature of the bake-out. Once the molten seals are formed in the detector modules, the heating can be discontinued to allow the solder to solidify, such that the internal volumes of the detector modules are sealed from the external atmosphere. The LV vessel can then be vented to air, while the internal volumes 214 of the detector modules are maintained at UHV pressures by continued pumping through UHV manifold 216.

The solder seal can be formed by placing a solder wire between the window and the base of the detector module. Alternatively, the solder seal can be formed using a solder wick having an external solder reservoir. When the solder is heated and melted, the reservoir is filled with molten solder, the solder is drawn ("wick'd") via capillary action into a precisely defined narrow gap between two components of the housing where it forms an airtight and vacuum-tight seal. The precisely defined gap may be provided by a portion of the solder wick that extends between the base and the window or may be defined by a portion of the base and/or window. Once the solder wicks are in place, a clamp can be used to firmly secure the window to the base to prevent movement of the components during the sealing process. Notably, this process can be carried out in the absence of solder fluxes. In addition, the pre-positioned clamps and spacer ensure that the components remain stationary and precisely located during the sealing process, ensuring a solder seal of reproducible thickness, independent of thermal non-uniformities in solder melting or difficult-to-control motions of the components during sealing. Optionally, the detector can be heated to higher than the melting temperature to remove hydrocarbons and water from the detector internal volume.

After the solder seals have been formed, the internal volume of the LV vessel can be opened to atmosphere and the top of the LV vessel can be removed, rendering detector modules 106 fully accessible for one or more post-sealing operations that can be carried out prior to sealing the connections between the detector modules and the UHV manifold. Such operations include, for example, leak-checking the detector modules, forming a photocathode material in-situ within the detector modules, and testing and/or characterizing the performance of the photocathodes. Once these post-sealing operations have been completed, detector modules 106 can be hermetically sealed by closing (e.g., pinching off) the conduits through which they are connected to UHV manifold 216. Examples of post-sealing performance tests that can be carried out after the solder seal is formed and solidified, but prior to the final pinch-off of the detector modules, include measurements of the electrical pulse production of the photocathodes when irradiated with one or more photon sources, such as a laser, diode, or radioactive source, electrical behavior tests, including the measurement of current-voltage (IV) curves, and limiting High Voltage (HV) behavior. Once testing and pinch-off are complete, the individual detector modules can be disconnected from the UHV manifold.

The detector modules in the system may share process controls, test and characterization equipment, and data logging systems. Process controls include, but are not limited to, multi-zone thermal control and feedback, multi-point temperature measurement, multi-point pressure monitoring, and residual gas analysis.

The pinch-off of the conduits to the internal volumes of the detector modules can be accomplished using a mechanically pinched cold-weld, in the case of a copper conduit, or a flame-seal, in the case of a glass conduit. Before the conduit(s) are pinched-off, each detector module can be separately isolated by closing valves disposed between the modules and the UHV manifold.

Both the LV vessel and the UHV manifold will be connected to a pumping system. The LV and UHV pumping systems can be independently controlled and will include at least one LV pump and at least one UHV pump, respectively, and will generally also include other components common to such systems, including valves and pressure gauges. By way of illustration, the UHV system may include a roughing pump, a turbo pump, and a cold trap, in order to evacuate the UHV manifold and the detector modules to pressures of less than $10^{-9}$ Torr or lower. In contrast, the LV vessel may include only a roughing pump and, optionally, a booster pump to evacuate the LV vessel to a pressure in the range from about $10^{-5}$ to $10^{-8}$ Torr. When multiple MCP-PMT fabrication systems are operated simultaneously, each system may have its own dedicated LV and UHV pumping systems, or multiple MCP-PMTs may be connected to the same master LV and/or master UHV pumping system.

The MCP-PMT fabrication systems also include an electrical system that includes the power supplies and electronic control circuits that run the pumps, heaters, valves, gauges, gas analyzers, and the like, and a control and data system that includes the computer hardware, software, and operator interfaces used to control the electronic systems and/or record data taken during the performance testing and characterization of the MCP-PMTs. When multiple MCP-PMT fabrication systems are operated simultaneously, each system may have its own dedicated electrical system and/or control and data system, or multiple MCP-PMTs may be connected to the same master electrical system and/or master control and data system.

Figure 3:
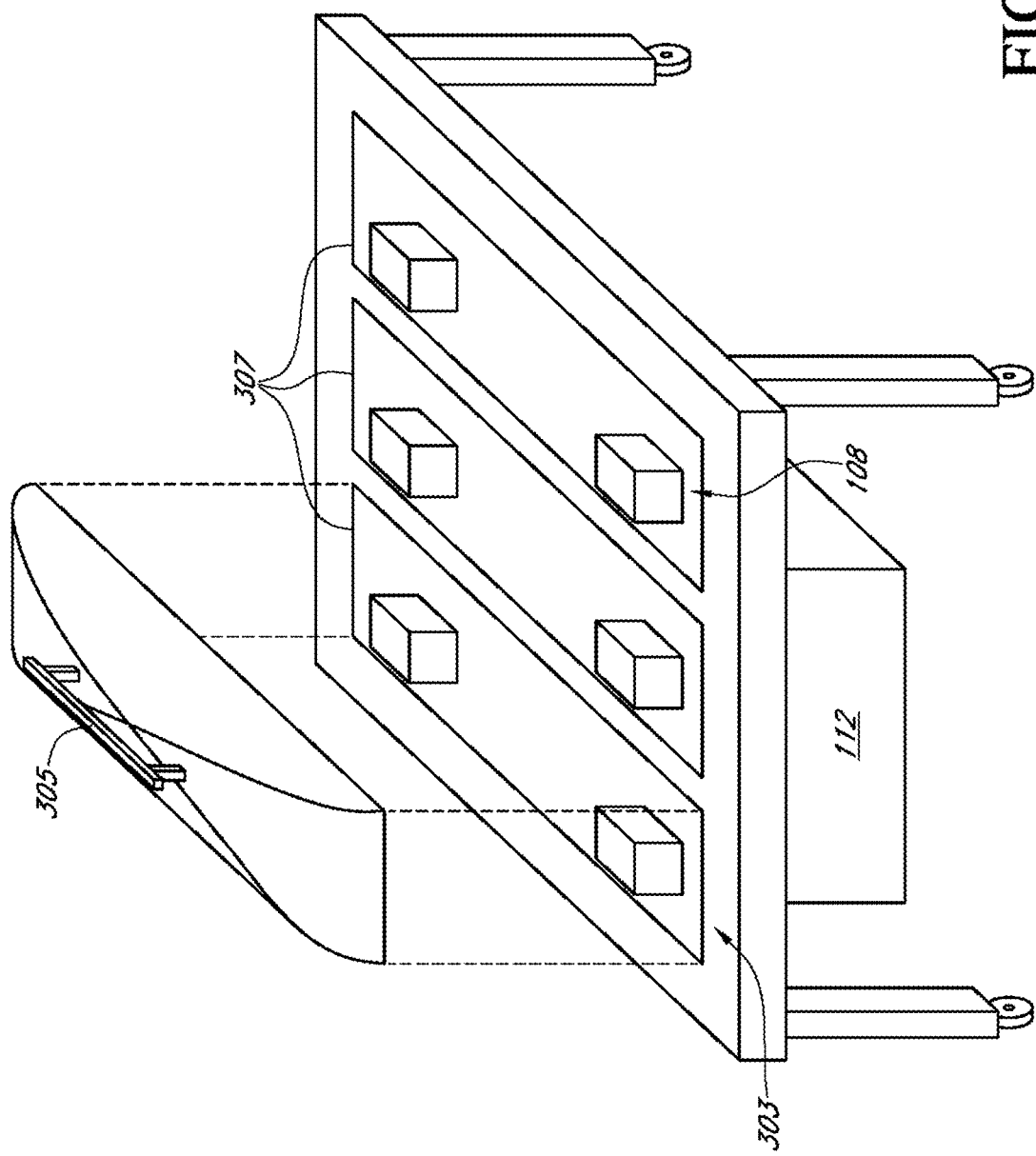
FIG. 3 shows a second embodiment of a system for the high-throughput fabrication of multiple MCP-PMTs.

FIG. 3 shows another embodiment of a system for the large-scale fabrication of MCP-PMTs. In this embodiment, multiple support manifolds 108 housing multiple detector modules (not shown) are contained within three separate LV vessels. The LV vessels share a common lower vessel part ("base") 303, but have their own dedicated upper vessel part 305 ("cover"). Upper vessel parts 305 are sealed to lower vessel parts 303 using three O-ring seals 307.

Figure 4:
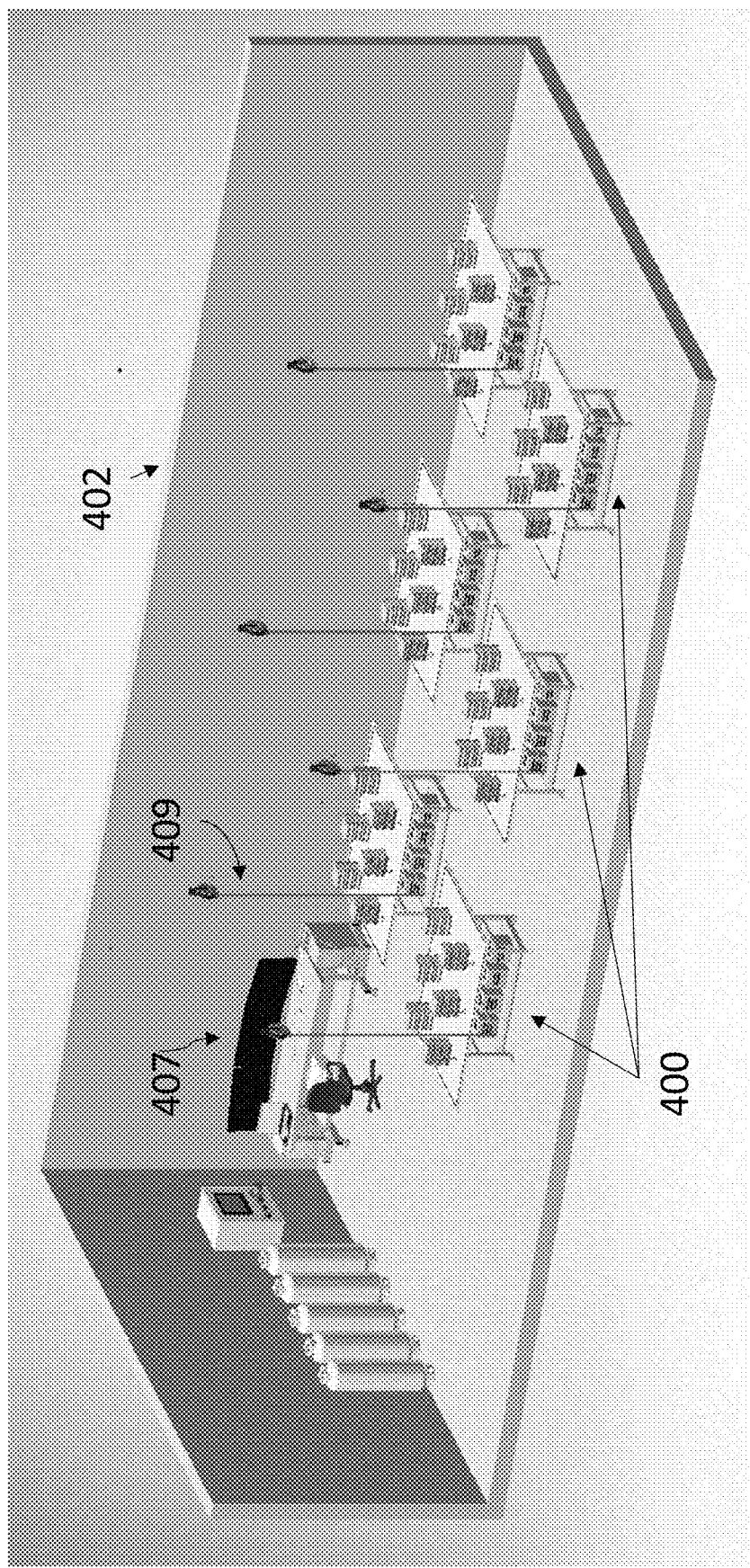
FIG. 4 shows an industrial production plant operating six systems for the fabrication of multiple MCP-PMTs.

FIG. 4 illustrates how multiple systems 400 for the fabrication of MCP-PMTs can be operated in a single building 402 within an industrial production plant. The embodiment depicted here includes six systems 400 arranged in a horizontal array of two rows. If, as shown here, each system includes six detector modules, the set-up will be capable of producing 216 MCP-PMT detector modules per week in a small foot-print.

In this embodiment, systems 400 include a common LV pumping system and a common UHV pumping system, a common electrical system, and a common control and data system 407 to which fabrication systems 400 are connected via appropriate connectors 409 (e.g., fluid conduits in the case of the pumping systems and electrical connections in the case of the electrical system).

Figure 5:
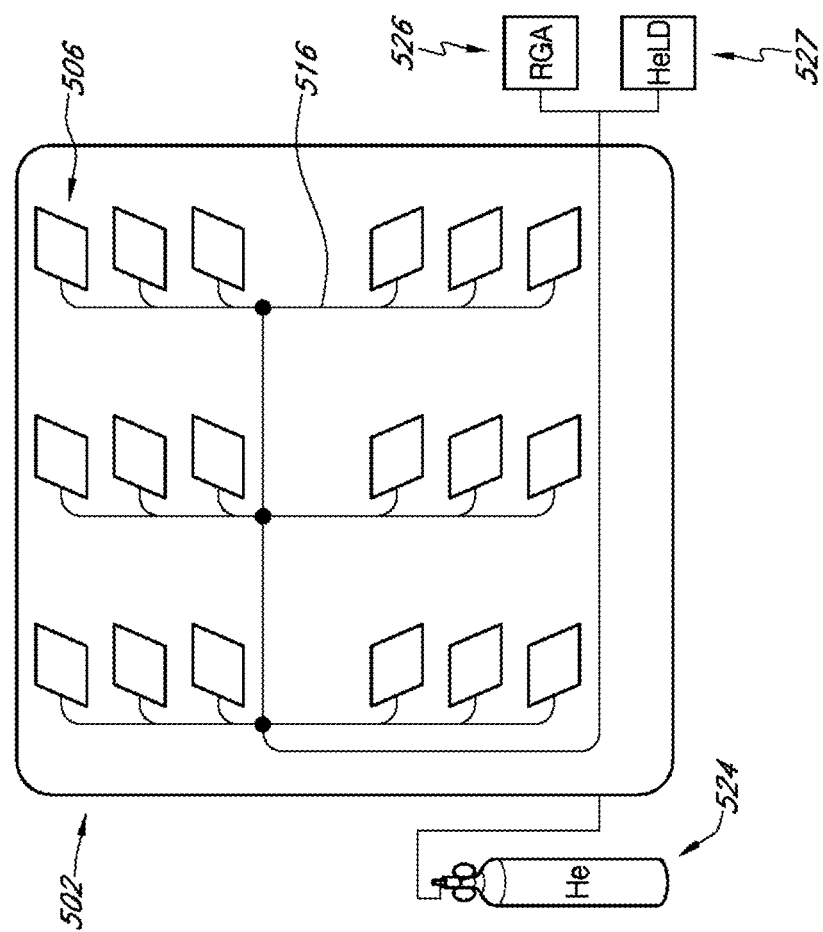
FIG. 5 shows a system for the high-throughput fabrication of multiple MCP-PMTs that is set up for leak-testing.

FIG. 5 shows an MCP-PMT fabrication system that is set-up for leak-checking the detector modules 506 after the solder seals in the detector modules have been formed, but while the detector modules continue to be evacuated through the UHV manifold. This system includes a UHV manifold 516 in communication with a residual gas analyzer 526 and a helium leak detector 527. A helium gas source 524 is connected to LV vessel 502. While detector modules 506 are still connected to the UHV manifold, a global leak check can be performed by introducing a tracer gas, typically He or Ar, into LV vessel 502, while sampling the interior volumes of detector modules 506 for the tracer with instruments sensitive to the tracer, such as He leak detector 527 or residual gas analyzer 526.

Figure 6:
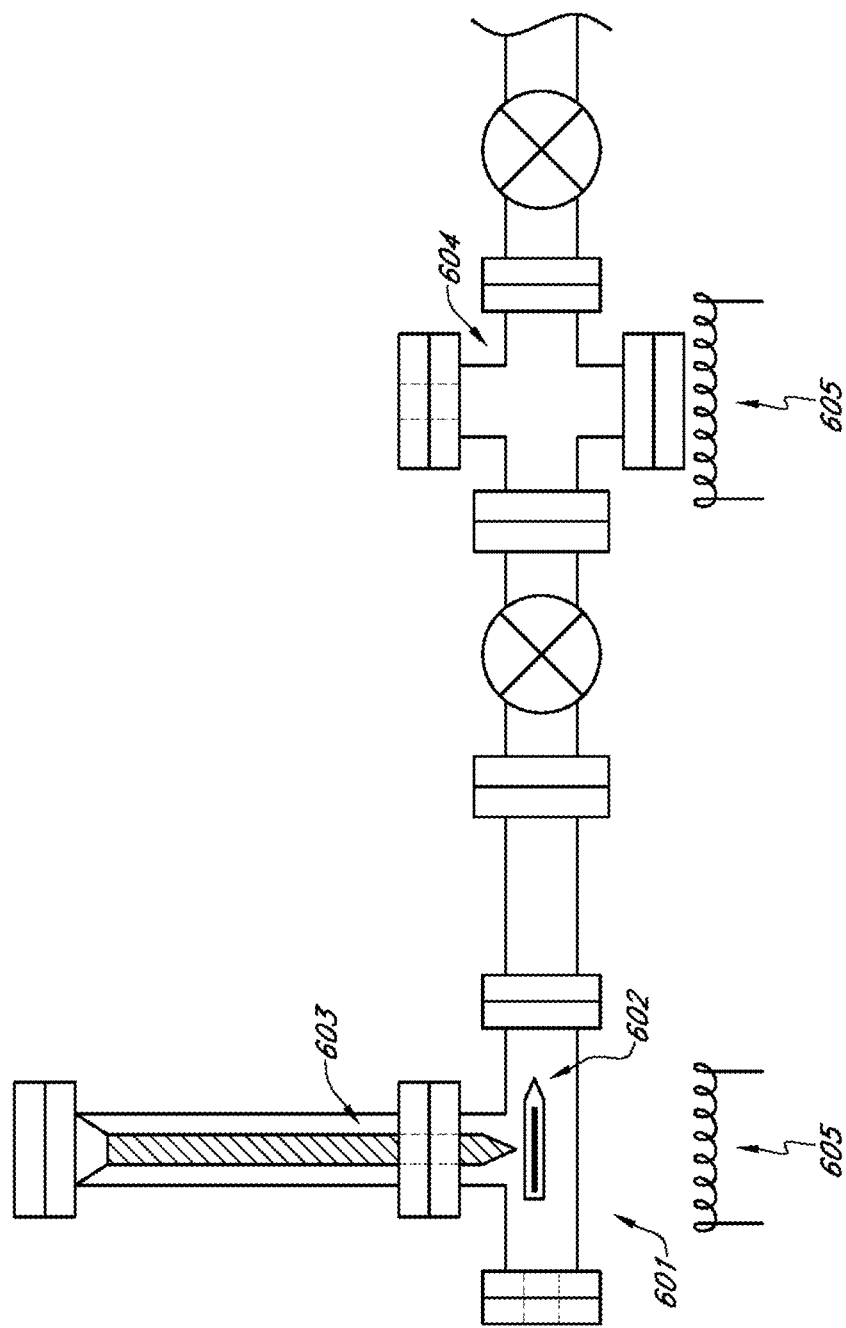
FIG. 6 shows an embodiment of an alkali vapor source.

FIG. 6 is an example of an alkali vapor source that can be connected to the UHV manifold and used to form a photocathode material on a cathode surface in the internal volume of a detector module after the module's solder seals have been formed and the LV vessel vented. The vapor source includes: a first chamber 601 that contains an alkali ampoule 602, a bellows-enabled breaker 603 of ampoule 602, a collection chamber 604 for the alkali vapor with a viewing window, distributed heating elements 605 to distill the alkali vapor by differential heating to an isolatable reservoir and then to the conduits, and the connection to the manifold.

FIG. 7 shows an example light-source scanning system for the characterization of the photocathodes in the detector modules after the solder seals have been formed, but while the detector modules remain connected to the UHV manifold. The scanning system can be connected to a support manifold, such as that shown in FIG. 2, after releasing the vacuum in the LV vessel and lifting the upper LV vessel part to provide full access to the modules during photocathode synthesis and post-processing. This embodiment of a scanning system includes a low-profile scanner 'wand' carrying multiple light sources such as optical fibers or local LEDs, which can be inserted directly above each module and scanned in 1-dimension across the module active area. FIG. 7 shows: (1) the footprint of a support in a support manifold, to which the scanner location is referenced; (2) the footprint of the active area of the photocathode in the detector module to be scanned; (3) the scanner 'wand' that holds the multiple light sources that are moved across the active area; (4) a scanner body that locates and records the 1-dimensional motion (7) of the scanner wand, attached to the fixture manifold after opening; (5) one of several light sources, in this example each being an optical fiber to a right-angle reflector on the wand; (6) one of several optical fibers driven by a pulsed LED or laser.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A system for fabricating a plurality of microchannel plate photomultiplier tube (MCP-PMT) detectors, the system comprising:

a low-vacuum vessel comprising a housing and a seal, wherein the housing and the seal define an interior volume;

a low-vacuum pumping system comprising at least one pump connected to the low-vacuum vessel, the low-vacuum pumping system configured to evacuate the interior volume of the low-vacuum vessel to a pressure in the range from $10^{-5}$ to $10^{-8}$ Torr;

a plurality of detector modules contained within the low-vacuum vessel, each detector module comprising:
a window;
a base, wherein the window and the base define an internal volume of the detector module; and
a microchannel-plate photomultiplier tube detector disposed within the internal volume of the detector module;

one or more heaters in thermal communication with the detector modules;

an ultrahigh-vacuum manifold connected to the internal volumes of the detector modules; and an ultrahigh-vacuum system comprising at least one pump connected to the ultrahigh-vacuum manifold, the ultrahigh-vacuum system configured to evacuate the ultrahigh-vacuum manifold to a pressure of $10^{-9}$ Torr or lower.

2. The system of claim 1, wherein the seal is an elastomeric O-ring or an elastomeric gasket.

3. The system of claim 1, further comprising an alkali metal vapor source connected to the ultrahigh-vacuum manifold and configured to introduce an alkali metal vapor into the internal volumes of the detector modules.

4. The system of claim 1, further comprising:
an inert gas source connected to the ultrahigh-vacuum manifold and configured to introduce an inert gas into the internal volumes of the detector modules; and
a residual gas analyzer connected to the ultrahigh-vacuum manifold and configured to sample gases present in the internal volumes of the detector modules.

5. The system of claim 1, wherein the plurality of detector modules comprises at least 100 detector modules.

6. The system of claim 1, wherein the plurality of detector modules comprises at least 500 detector modules.

7. A method for fabricating a plurality of microchannel plate photomultiplier tube (MCP-PMT) detectors using a system comprising:
a low-vacuum vessel comprising a housing and a seal, wherein the housing and the seal define an interior volume;
a low-vacuum pumping system comprising at least one pump connected to the low-vacuum vessel;
a plurality of detector modules contained within the low-vacuum vessel, each detector module comprising:
a window;
a base, wherein the window and the base define an internal volume of the detector module; and
a microchannel-plate photomultiplier tube detector disposed within the internal volume of the detector module;
one or more heaters in thermal communication with the detector modules;
an ultrahigh-vacuum manifold connected to the internal volumes of the detector modules; and
an ultrahigh-vacuum system comprising at least one pump connected to the ultrahigh-vacuum manifold,
the method comprising:
placing solder into a gap between the window and the base of the detector modules or adjacent to a gap between the window and the base of the detector modules;
evacuating the internal volume of the low-vacuum vessel to a low vacuum pressure in the range from $10^{-5}$ to $10^{-8}$ Torr;
evacuating the ultrahigh-vacuum manifold and the internal volumes of the detector modules to an ultrahigh vacuum pressure of $10^{-9}$ Torr or lower;
heating the detector modules to a temperature at which the solder melts to fill the gaps between the windows and the bases, while the low vacuum pressure is maintained in the internal volume of the low-vacuum vessel and the ultrahigh vacuum pressure is maintained in the internal volumes of the detector modules;
cooling the detector modules to a temperature at which the solder solidifies to form a solder seal between the windows and the bases, while the low vacuum pressure is maintained in the internal volume of the low-vacuum vessel and the ultrahigh vacuum pressure is maintained in the internal volumes of the detector modules; and
releasing the vacuum in the internal volume of the low-vacuum vessel.

8. The method of claim 7, wherein the low vacuum pressure is in the range from $1\times10^{-5}$ to $1\times10^{-7}$ Torr.

9. The method of claim 7, further comprising leak testing all or selected detector modules by introducing a tracer gas into the low-vacuum vessel while maintaining the ultrahigh-vacuum pressure in the ultrahigh vacuum manifold and the internal volumes of the detector modules.

10. The method of claim 7, further comprising forming a photocathode material on cathode surfaces of the microchannel plate detectors while maintaining the ultrahigh-vacuum pressure in the ultrahigh vacuum manifold and internal volumes of the detector modules.

11. The method of claim 7, further comprising testing a performance parameter of one or more of the microchannel plate detectors.

12. The method of claim 7, wherein fabricating the plurality of microchannel plate photomultiplier tube (MCP-PMT) detectors is conducted without heating the low vacuum vessel.

\* \* \* \* \*